United States Patent
Kim et al.

(10) Patent No.: US 10,460,799 B2
(45) Date of Patent: Oct. 29, 2019

(54) METHOD OF READING RESISTIVE MEMORY DEVICE

(71) Applicant: SK hynix Inc., Incheon-si (KR)

(72) Inventors: Kyung Wan Kim, Icheon-si (KR); Tae Jung Ha, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/167,051

(22) Filed: Oct. 22, 2018

(65) Prior Publication Data

US 2019/0244661 A1    Aug. 8, 2019

(30) Foreign Application Priority Data

Feb. 8, 2018   (KR) .......................... 10-2018-0015857

(51) Int. Cl.
  *G11C 13/00*   (2006.01)
  *H01L 27/24*   (2006.01)

(52) U.S. Cl.
  CPC .......... *G11C 13/004* (2013.01); *G11C 13/003* (2013.01); *H01L 27/2463* (2013.01); *G11C 2013/0045* (2013.01); *G11C 2013/0054* (2013.01)

(58) Field of Classification Search
  CPC ................................................ H01L 27/2463
  See application file for complete search history.

(56) References Cited

U.S. PATENT DOCUMENTS

| | | | |
|---|---|---|---|
| 9,916,894 B2* | 3/2018 | Ha | G11C 11/16 |
| 10,283,197 B1* | 5/2019 | Kim | G11C 13/0033 |
| 2013/0322156 A1 | 12/2013 | Papandreou et al. | |
| 2018/0151204 A1* | 5/2018 | Hong | G11C 13/0035 |
| 2019/0164601 A1* | 5/2019 | Na | G11C 13/0004 |
| 2019/0172531 A1* | 6/2019 | Lim | G11C 13/0004 |

FOREIGN PATENT DOCUMENTS

KR    10-2015-0099090 A    8/2015

* cited by examiner

*Primary Examiner* — Harry W Byrne
*Assistant Examiner* — R Lance Reidlinger

(57) ABSTRACT

In a method of reading a resistive memory device according to an embodiment, a memory cell including a selection element and a variable resistance element is prepared. The selection element exhibits a snap-back behavior on a current-voltage sweep curve for the memory cell. First and second read voltages to be applied to the memory cell are determined within a voltage range in which the selection element maintains a turned-on state. The magnitude of the second read voltage is less than that of the first read voltage and selected in a voltage range in which the selection element exhibits the snap-back behavior. The first read voltage is applied to the memory cell to measure a first cell current. The second read voltage is applied to the memory cell to measure a second cell current. A resistance state stored in the memory cell is determined based on the first cell current and the second cell current.

17 Claims, 14 Drawing Sheets

METHOD OF READING RESISTIVE MEMORY DEVICE

CROSS-REFERENCE TO RELATED APPLICATION

The present application claims priority under 35 U.S.C. 119(a) to Korean Patent Application No. 10-2018-0015857, filed on Feb. 8, 2018, which is herein incorporated by reference in its entirety.

BACKGROUND

1. Technical Field

Various embodiments of the present disclosure generally relate to a resistive memory device and more particularly relate to a method of reading data stored in a resistive memory device.

2. Related Art

Generally, a resistive memory device is a device that induces a resistance variation in a nonvolatile memory material layer located in a memory cell and that stores different data depending on a resistance state. The resistive memory device can include a resistive random access memory (RAM) device, a phase change RAM device, a magnetic RAM device or the like.

Recently, a three-dimensional cell structure, such as a cross-point array structure, has been proposed as a cell structure of a resistive memory device for the purpose of high integration of memory device. As an example, the cross-point array structure may have a cell structure in which a pillar-shaped cell is disposed between electrodes intersecting on different planes.

SUMMARY

There is disclosed a method of reading a resistive memory device according to one aspect of the present disclosure. In the method of reading a resistive memory device, a memory cell including a selection element and a variable resistance element is prepared. At this time, the selection element exhibits a snap-back behavior on a current-voltage sweep curve for the memory cell. First and second read voltages to be applied to the memory cell are within a voltage range in which the selection element maintains a turned-on state. The magnitude of the second read voltage is less than that of the first read voltage, and the second read voltage is in a voltage range in which the selection element exhibits the snap-back behavior. The first read voltage is applied to the memory cell to measure a first cell current. The second read voltage is applied to the memory cell to measure a second cell current. A resistance state stored in the memory cell is determined based on the first cell current and the second cell current.

DETAILED DESCRIPTION

Figure 1:
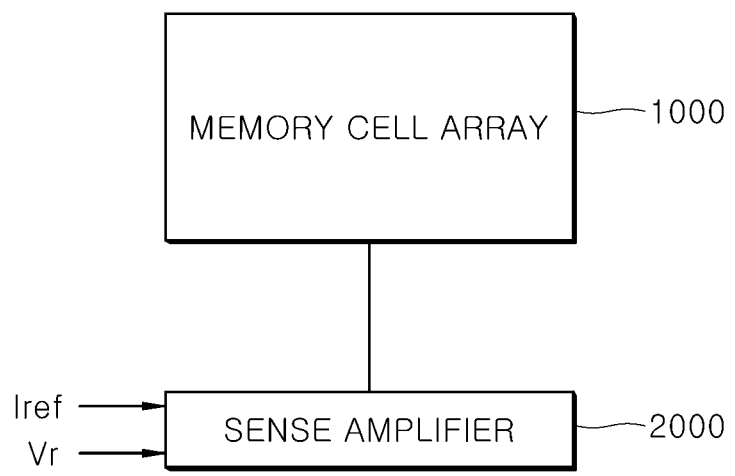
FIG. 1 is a block diagram schematically illustrating a resistive memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

A threshold switching operation of a selection element described in this specification may mean a switching operation in which, when an external voltage is applied to the selection element, the selection element is turned on when the applied voltage is increased to a threshold voltage or higher, and the selection element is turned off from the turned-on state when the applied voltage decreases below the threshold voltage again. However, when the external voltage is removed, the selection element can always remain in a turn-off state. That is, the threshold switching operation may be a non-memory switching operation with volatility.

A variable resistance element described in this specification may mean an element that can variably have two or more resistance states that are mutually distinguished from each other according to magnitude or polarity of an externally applied voltage. The variable resistance element can store the variable resistance state as a logical data value in a nonvolatile manner.

In this specification, a "low resistance state" and a "high resistance state" of the variable resistance element or a selection element may be interpreted as a relative concept for identifying the resistance states of each other, rather than being interpreted as a resistance state having a specific resistance value. As an example, the "low resistance state" and "high resistance state" of the variable resistance element may correspond to data information of '0' or '1', respectively. In addition, the 'high resistance state' of the selection element may mean a turned-off state, and the 'low resistance state' may mean a turned-on state.

FIG. 1 is a block diagram schematically illustrating a resistive memory device according to an embodiment of the present disclosure. Referring to FIG. 1, the resistive memory device 1 may include a memory cell array 1000 and a sense amplifier 2000.

The memory cell array 1000 may include a plurality of nonvolatile memory cells. When a predetermined memory cell among the plurality of nonvolatile memory cells is selected, the sense amplifier 2000 may sense data written in the selected memory cell and may amplify the sensed data to convert it into a binary logic value. Also, the sense amplifier 2000 may output the converted binary logic value to a buffer of a subsequent stage. In an embodiment, an externally provided read voltage $V_r$ and a reference current $I_{ref}$ may be used. The read voltage $V_r$ is provided to the memory cell array 1000. The sense amplifier 2000 may measure a current generated in the memory cell in response to the read voltage $V_r$, and compare the measured current with the reference current $I_{ref}$ to output a logic value of the data stored in the memory cell.

Figure 2:
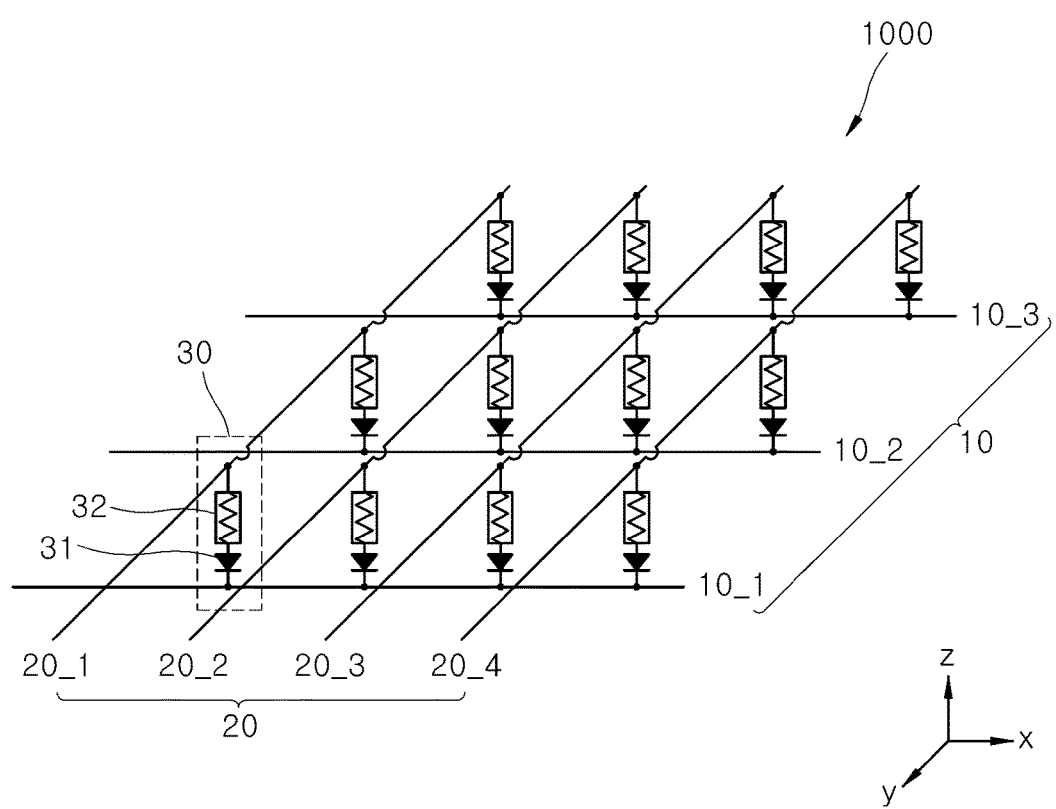
FIG. 2 is a view schematically illustrating a memory cell array of a resistive memory device according to an embodiment of the present disclosure.

FIG. 2 is a view schematically illustrating a memory cell array of a resistive memory device according to an embodiment of the present disclosure. Referring to FIG. 2, the memory cell array 1000 may have a cross-point array structure. Specifically, the memory cell array 1000 may have first conductive lines 10 extending in a first direction (for example, x-direction) and second conductive lines 20 extending in a second direction (for example, y-direction) that is not parallel to the first direction. Each of the first conductive lines 10 and second conductive lines 20 may include a plurality of first lines 10_1, 10_2 and 10_3 and a plurality of second lines 20_1, 20_2, 20_3 and 20_4. A plurality of memory cells may be disposed at regions where the first lines (10_1, 10_2 and 10_3) and the corresponding second lines (20_1, 20_2, 20_3 and 20_4) intersect. Although FIG. 2 illustrates three first lines 10_1, 10_2 and 10_30 and four second lines 20_1, 20_2, 20_3 and 20_4, numbers of first lines and second lines may not be limited thereto. Various other numbers of first lines and second lines may be possible.

A memory cell 30 may include a selection element 31 and a variable resistance element 32 that are connected in series to each other. In some embodiments, the selection element 31 may perform a threshold switching operation in response to an externally applied read voltage during a read operation with respect to the memory cell 30. Accordingly, a read operation error due to a sneak current or leakage current occurring between neighboring memory cells 30 can be suppressed. The selection element 31 may include, for example, a transistor, a diode, a tunnel barrier device, an ovonic threshold switch, a metal-insulator-metal switch and the like.

The variable resistance element 32 may be an electrical element that stores a nonvolatile logical signal that changes in accordance with the resistance change of an internal resistance change material layer. The variable resistance element 32 may include, for example, a resistive RAM, a phase change RAM, or a magnetic RAM.

Figure 3:
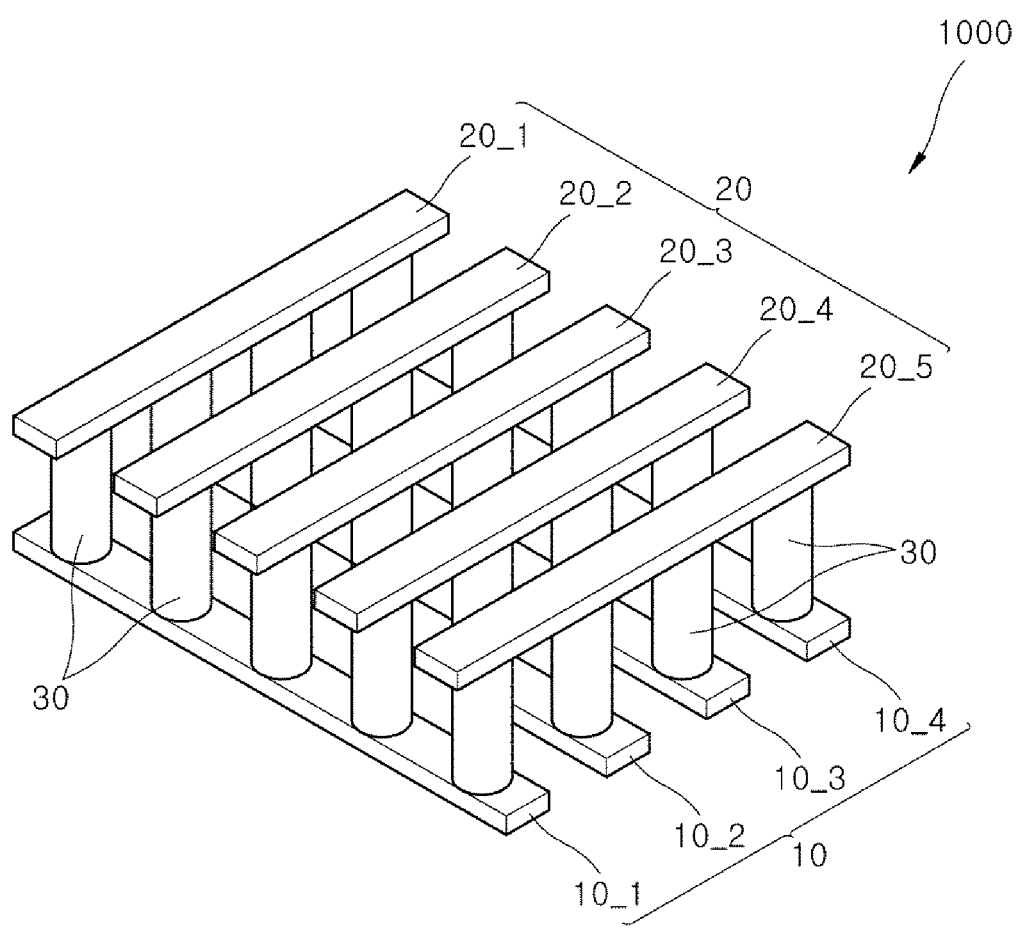
FIG. 3 is a perspective view illustrating a memory cell array structure of a resistive memory device according to an embodiment of the present disclosure.
Figure 3:
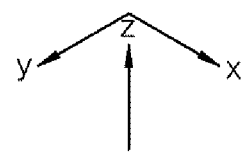
Figure 4:
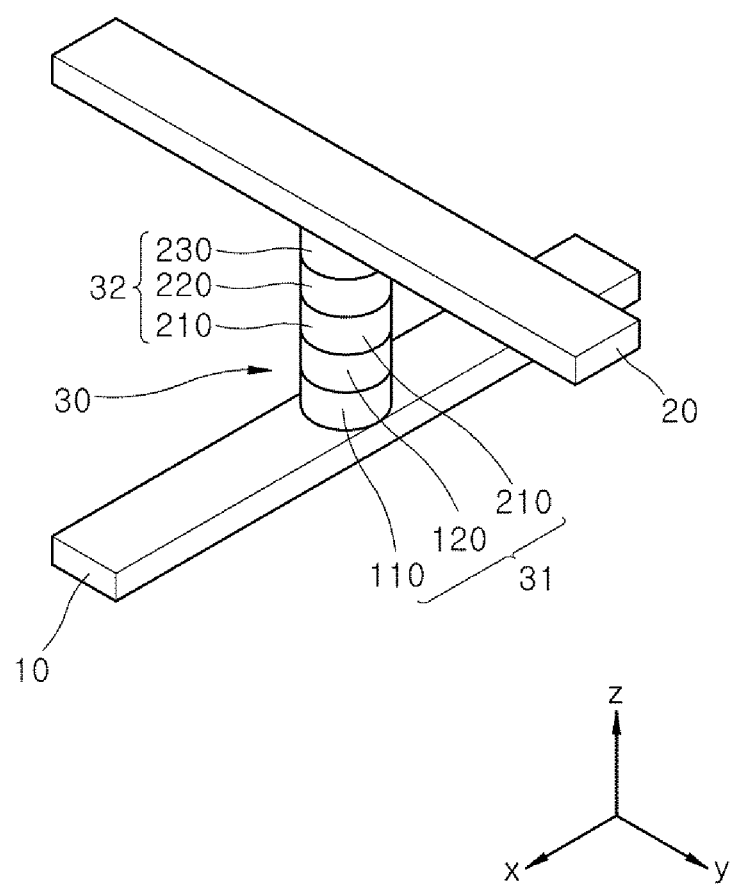
FIG. 4 is a perspective view illustrating a unit memory cell of a memory cell array of a resistive memory device according to an embodiment of the present disclosure.

FIG. 3 is a perspective view illustrating a memory cell array structure of a resistive memory device according to an embodiment of the present disclosure. FIG. 4 is a perspective view illustrating a unit memory cell of the memory cell array of FIG. 3. Hereinafter, with reference to FIGS. 3 and 4, an example in which the variable resistance element of the memory cell 30 is a resistive memory element and the selection element of the memory cell 30 is a threshold switch having a first metal electrode/insulating layer/second metal electrode structure will be described. However, inventive concepts of the present disclosure are not limited thereto, and various kinds of variable resistance elements and selection elements described above can be applied or used.

Referring to FIG. 3, the memory cell array 1000 may include first conductive lines 10 extending in a first direction (that is, x-direction), second conductive lines 20 extending in a second direction (that is, y-direction), and memory cells 30 in a form of a pillar-shaped structures extending in a z-direction and disposed in overlap regions between the first and second conductive lines 10 and 20. Each of the first conductive lines 10 and second conductive lines 20 may include a plurality of first lines 10_1, 10_2, 10_3, 10_4 and a plurality of second lines 20_1, 20_2, 20_3, 20_4, 20_5.

Referring to FIG. 4, the memory cell 30 may include a selection element 31 and a variable resistance element 32 that are connected in series to each other. The selection element 31 may include a lower electrode layer 110, an insulating layer 120 and an intermediate electrode layer 210. The variable resistance element 32 may include the intermediate electrode layer 210, a resistive memory layer 220 and an upper electrode layer 230. At this time, the intermediate electrode layer 210 may be shared by the selection element 31 and the variable resistance element 32.

In the memory cell 30, each of the lower electrode layer 110, the intermediate electrode layer 210 and the upper electrode layer 230 may include a conductive material. Specifically, the conductive material may include, for example, metal, conductive nitride, conductive oxide and the like. As an example, each of the lower electrode layer 110, the intermediate electrode layer 210 and the upper electrode layer 230 may include at least one of gold (Au), aluminum (Al), platinum (Pt), copper (Cu), silver (Ag), ruthenium (Ru), titanium (Ti), iridium (Ir), tungsten (W), titanium nitride (TiN), tantalum nitride (TaN), ruthenium oxide ($RuO_2$) and the like.

The insulating layer 120 of the selection element 31 may include silicon oxide, silicon nitride, metal oxide, metal nitride or a combination of two or more thereof. As an example, the insulating layer 120 may include aluminum oxide, zirconium oxide, hafnium oxide, tungsten oxide, titanium oxide, nickel oxide, copper oxide, manganese oxide, tantalum oxide, niobium oxide or iron oxide. The insulating layer 120 may include a compound that does not satisfy the stoichiometric ratio. The insulating layer 120 may have an amorphous structure.

In an embodiment, trap sites caused by the non-stoichiometric ratio of the insulating layer 120 may be created and distributed in the insulating layer 120, which trap conductive carriers in the insulating layer 120. When an externally applied voltage increases to become equal to a predetermined threshold voltage or higher, the conductive carriers trapped at the trap sites may conduct along an electric field formed by the external voltage through the insulating layer 120. Accordingly, the selection element 31 can be turned on. On the other hand, when the externally applied voltage decreases below a predetermined threshold voltage, the conductive carriers may be trapped at the trap sites and conduction by the conductive carriers can be suppressed. Accordingly, the selection element 31 can be turned off from a turned-on state. In an embodiment, the trap sites may be generated by a dopant injected into the insulating layer 120.

A variety of materials that produce an energy level capable of receiving the conductive carriers in the insulating layer 120 can be used as the dopant. As an example, when the insulating layer 120 includes silicon oxide or silicon nitride, the dopant may include at least one of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), and arsenic (As). As another example, when the insulating layer 120 includes aluminum oxide or aluminum nitride, the dopant may include at least one of titanium (Ti), copper (Cu), zirconium (Zr), hafnium (Hf), niobium (Nb), vanadium (V), tantalum (Ta), tungsten (W), chromium (Cr), molybdenum (Mo), boron (B), nitrogen (N), carbon (C), phosphorus (P) and arsenic (As). In an embodiment, when the insulating layer 120 includes the dopant of a predetermined concentration, as described below in connection with FIGS. 6A and 6B, the selection element 31 may exhibit snap-back behavior on a current-voltage sweep curve. The snap-back behavior may mean a phenomenon in which, when measuring an output voltage while sweeping an input current with respect to the selection element 31, the output voltage temporarily decreases when the input current reaches a predetermined turn-on threshold current.

The resistive memory layer 220 of the variable resistance element 32 may include a material whose resistance is variably changed between a high resistance state and a low resistance state according to an externally applied voltage. The resistive memory layer 220 may include, as an example, metal oxide such as titanium oxide, aluminum oxide, nickel oxide, copper oxide, zirconium oxide, manganese oxide, hafnium oxide, tungsten oxide, tantalum oxide, niobium oxide or iron oxide. The resistive memory layer 220 may include, as another example, a perovskite-based material such as PCMO ($Pr_{0.7}Ca_{0.3}MnO_3$), LCMO ($La_{1-x}Ca_xMnO_3$), BSCFO ($Ba_{0.5}Sr_{0.5}Co_{0.8}Fe_{0.2}O_{3-\delta}$), YBCO ($YBa_2Cu_3O_{7-x}$), (Ba, Sr)$TiO_3$(Cr, Nb-doped), $SrZrO_3$(Cr, V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, or $YBa_2Cu_3O_7$, and the like. The resistive memory layer 220 may include, as yet another example, a selenide-based material such as $Ge_xSe_{1-x}$ (Ag, Cu, Te-doped) or metal sulfide such as $Ag_2S$, $Cu_2S$, CdS, ZnS, and the like.

Figure 5:
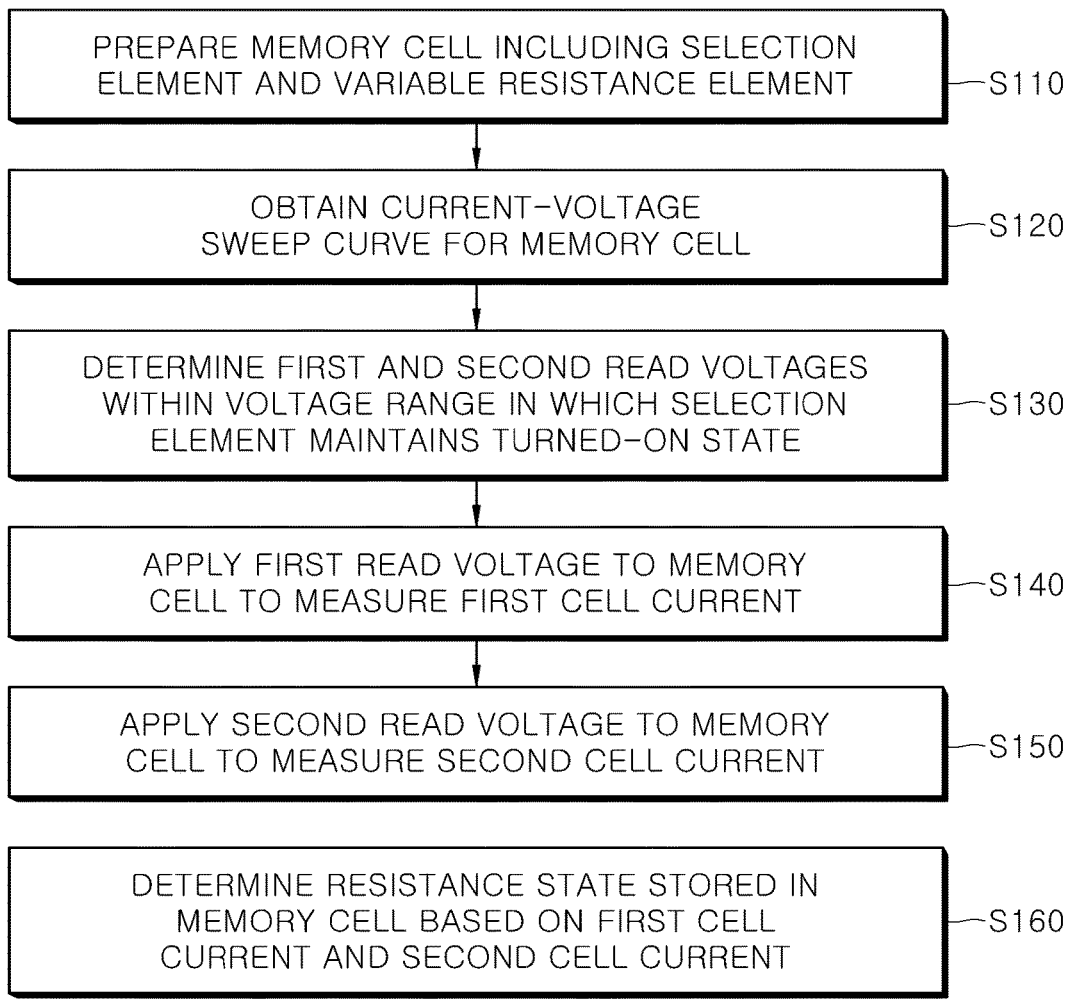
FIG. 5 is a flow chart schematically illustrating a method of reading a resistive memory device according to an embodiment of the present disclosure.
Figure 6A:
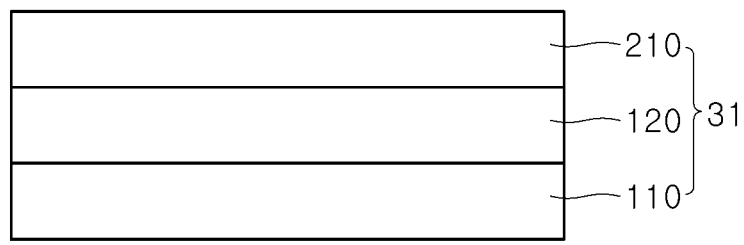
FIG. 6A is a cross-sectional view of a selection element of a resistive memory device according to an embodiment of the present disclosure.
Figure 6B:
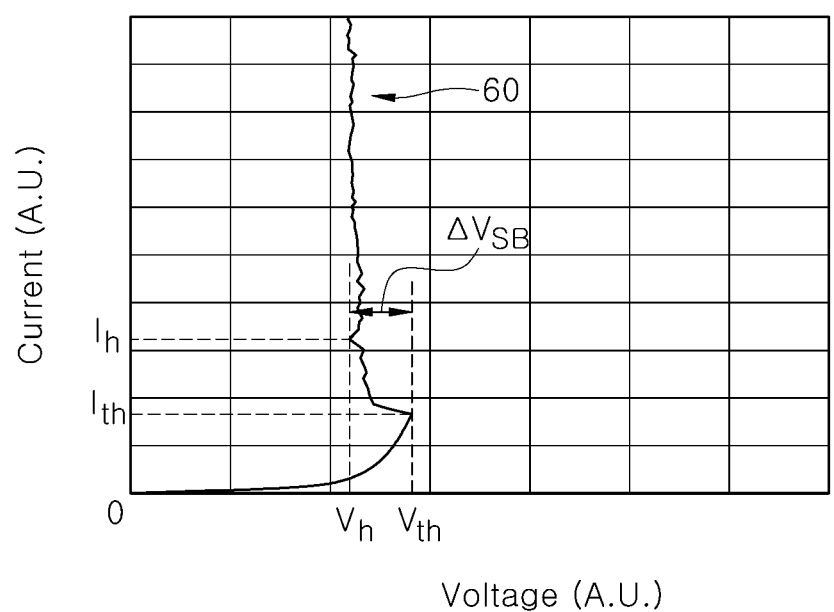
FIG. 6B is a graph illustrating a current-voltage sweep characteristic of the selection element of the resistive memory device according to an embodiment of the present disclosure
Figure 7A:
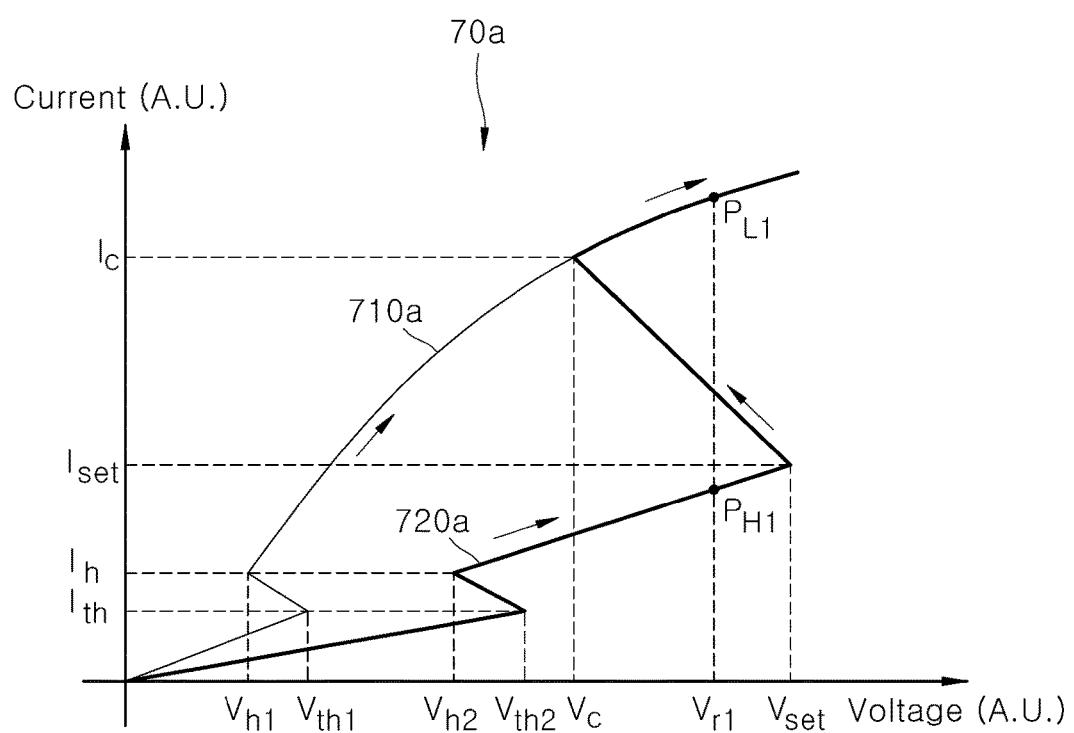
FIGS. 7A and 7B are graphs schematically illustrating an output voltage according to a current sweep in a memory cell of a resistive memory device according to an embodiment of the present disclosure.
Figure 7B:
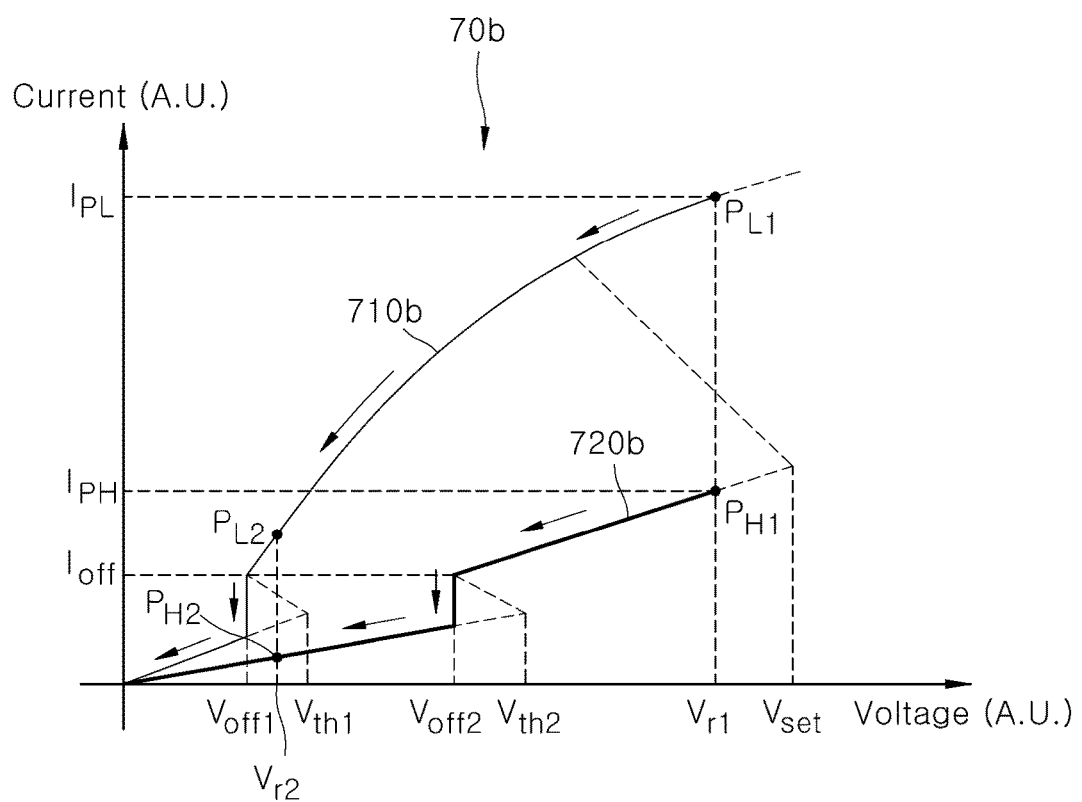
Figure 8A:
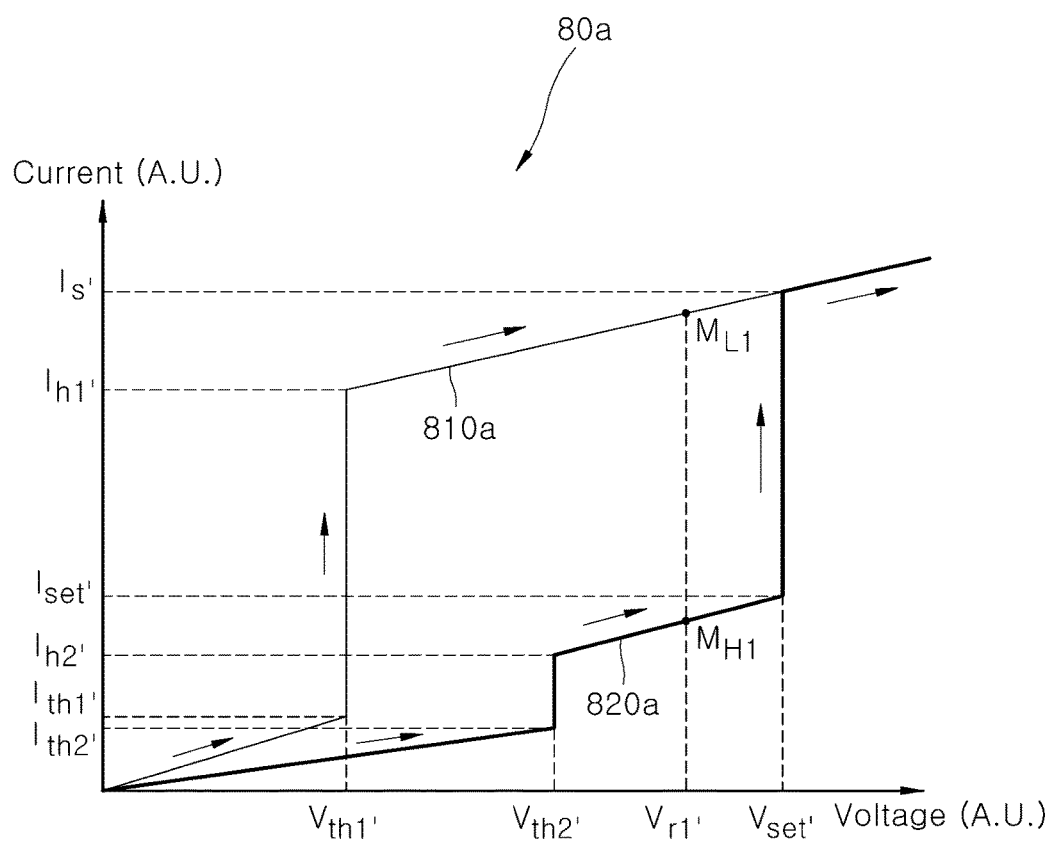
FIGS. 8A and 8B are graphs schematically illustrating an output current according to a voltage sweep, in a memory cell of a resistive memory device according to an embodiment of the present disclosure.
Figure 8B:
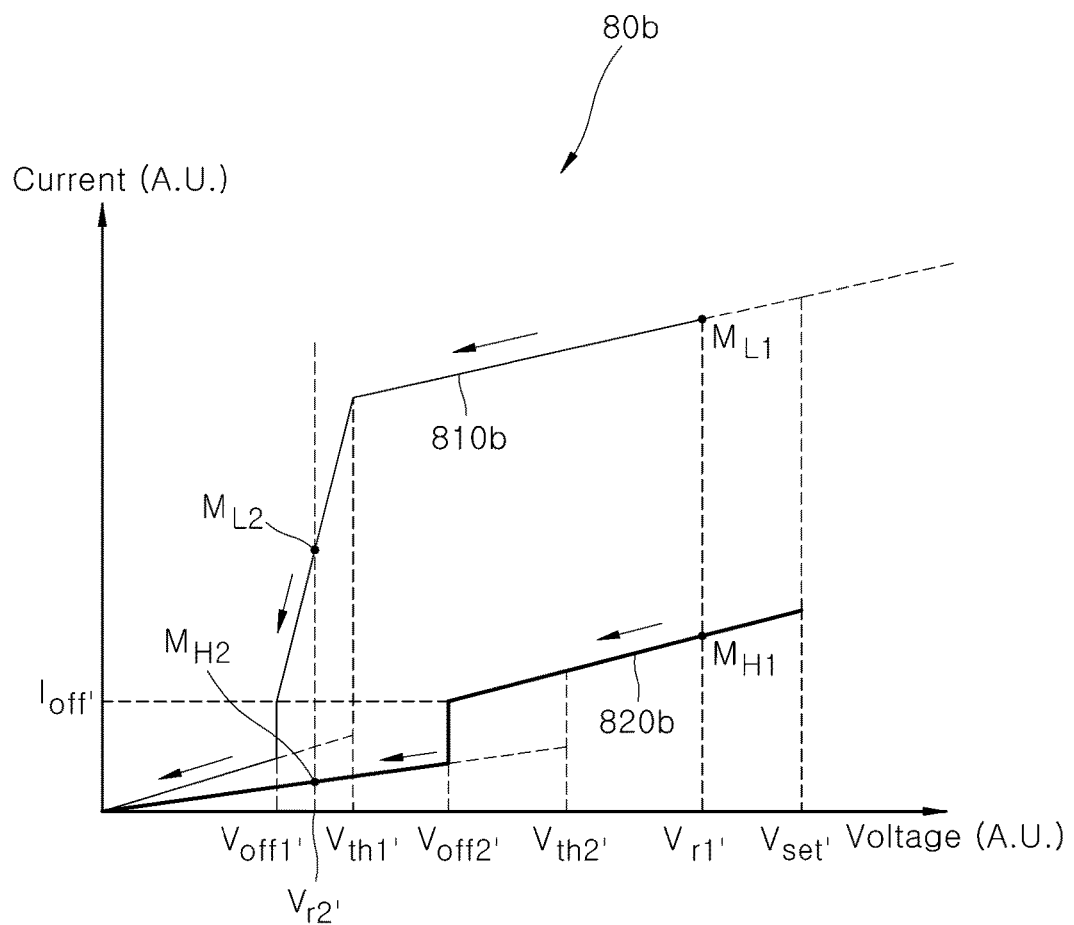

FIG. 5 is a flow chart schematically illustrating a method of reading a resistive memory device according to an embodiment of the present disclosure. FIG. 6A is a cross-sectional view of a selection element of a resistive memory device according to an embodiment of the present disclosure and FIG. 6B is a graph illustrating a current-voltage sweep characteristic of the selection element of a resistive memory device according to an embodiment of the present disclosure. FIGS. 7A and 7B are graphs schematically illustrating an output voltage according to a current sweep in a memory cell of a resistive memory device according to an embodiment of the present disclosure. FIGS. 8A and 8B are graphs schematically illustrating an output current according to a voltage sweep in a memory cell of a resistive memory device according to an embodiment of the present disclosure. The method of reading a resistive memory device according to an embodiment of the present disclosure may be described using the resistive memory device 1 described above in connection with FIGS. 1 to 4.

Referring to FIG. 5, a method of reading a resistive memory device 1 may be performed as follows. As described in S110, a memory cell 30 including a selection element 31 and a variable resistance element 32 may be prepared. As described in S120, a current-voltage sweep curve with respect to the memory cell 30 may be obtained. As described in S130, first and second read voltages to be applied to the memory cell 30 may be determined within a voltage range in which the selection element 31 maintains or remains in a turned-on state. As described in S140, the first read voltage may be applied to the memory cell 30 and a first cell current is measured. As described in S150, the second read voltage may be applied to the memory cell 30 and a second cell current is measured. As described in S160, a resistance state stored in the memory cell 30 may be determined based on the first and second cell currents.

Hereinafter, the method of reading the resistive memory device 1 will be described with reference to FIGS. 5 to 9 in detail. The resistive memory device 1 includes a first conductive line extending in a first direction and a second conductive line extending in a second direction that is not parallel to the first direction. The memory cell 30 is located along a third direction to bridge the first and second conductive lines.

Preparing a Memory Cell

Referring to S110 of FIG. 5, a memory cell 30 including a selection element 31 and a variable resistance element 32 may be prepared. The selection element 31 may perform a threshold switching operation. The variable resistance element 32 may store internal resistance value in a nonvolatile manner.

Obtaining Current-Voltage Sweep Curve

Referring to S120 of FIG. 5, current-voltage sweep curves for the memory cell 30 may be obtained. The current-voltage sweep curves may be curves 70a and 70b obtained by applying an input current to the memory cell 30 while sweeping, and measuring an output voltage from the memory cell 30, as shown in FIGS. 7A and 7B. Alternatively, the current-voltage sweep curves may be curves 80a and 80b obtained by applying an input voltage to the memory cell 30 while sweeping, and measuring an output current from the memory cell 30, as shown in FIGS. 8A and 8B.

In an embodiment, the snap-back behavior of selection element 31 is reflected in the current-voltage sweep curve 60 of the selection element 31 shown in FIG. 6B, and in a first sweep graph 70a of the current-voltage sweep curve of the memory cell 30 shown in FIG. 7A. The snap-back behavior can be explained using the current-voltage sweep curve 60 measured from the selection element 31, in reference to FIGS. 6A and 6B. The current-voltage sweep curve 60 in FIG. 6B can be obtained by applying an input current between a lower electrode layer 110 and an intermediate electrode layer 210 of the selection element 31 illustrated in FIG. 6A while sweeping, and measuring a voltage output from the selection element 31.

In an embodiment, as described above, the insulating layer 120 may include silicon oxide, silicon nitride, metal oxide, metal nitride, or a combination of two or more thereof. The insulating layer 120 may include a predetermined dopant to generate trap sites. The dopant may include at least one of, for example, aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), or a combination of two or more thereof.

Referring to FIGS. 6A and 6B, a method of applying the input current between the lower electrode layer 110 and the intermediate electrode layer 210 may be performed by sweeping the input current while increasing from 0 A. The output voltage increases in proportion to the input current until the applied input current reaches a turn-on threshold current $I_{th}$. The selection element 31 may maintain a high resistance state within the input current range below the turn-on threshold current $I_{th}$.

When the input current reaches the turn-on threshold current $I_{th}$, the output voltage may be rapidly decreased. The decrease of the output voltage may be continuous until the input current reaches a turn-on hold current $I_h$. The voltage corresponding to the turn-on threshold current $I_{th}$ may be referred to as a turn-on threshold voltage $V_{th}$, and the output voltage corresponding to the turn-on hold current $I_h$ may be referred to as a turn-on hold voltage $V_h$. As described above, a phenomenon in which the output voltage decreases from the turn-on threshold voltage $V_{th}$ to the turn-on hold voltage $V_h$, when the input current is equal to or higher than the turn-on threshold current $I_{th}$, can be referred to as snap-back behavior.

Referring to FIG. 6B, the output voltage may not be increased over the turn-on threshold voltage $V_{th}$ even if the input current is increased after the snap-back behavior occurs. That is, when the input current reaches the turn-on threshold current $I_{th}$, the selection element 31 may be turned-on so that the resistance state of the selection element 31 may be switched from a high resistance state to a low resistance state. In addition, when the input current is equal to or higher than the turn-on threshold current $I_{th}$, the selection element 31 remains in the low resistance state.

As illustrated in the current-voltage sweep curve 60 of FIG. 6B, after the snap-back behavior occurs, the output voltage of the selection element 31 can be held within a predetermined voltage range regardless of the applied current. The turn-on hold voltage $V_h$ may mean a minimum output voltage at which the selection element 31 stays in a turned-on state. At this time, on the current-voltage sweep curve 60, the voltage difference between the turn-on threshold voltage $V_{th}$ and the turn-on hold voltage $V_h$ may be referred to as a snap-back voltage $\Delta V_{SB}$.

Referring to FIGS. 7A and 7B, these current-voltage sweep curves with respect to the memory cell 30 may be obtained by applying an input current to the memory cell 30 while sweeping, and measuring an output voltage from the memory cell 30. The current-voltage sweep curve may include current-voltage measurement portions 710a and 710b when the variable resistance element 32 is in a low resistance state and current-voltage measurement portions 720a and 720b when the variable resistance element 32 is in a high resistance state. Further, the current-voltage sweep curve can be classified into the first and second sweep graphs 70a and 70b. The first sweep graph 70a shows the result of measuring the output voltage while continuously increasing the magnitude of the applied current to the memory cell 30 from 0 A, as shown in FIG. 7A. The second sweep graph 70b shows the result of measuring the output voltage while continuously decreasing the magnitude of the applied current from a predetermined current to 0 A, as shown in FIG. 7B. In an embodiment, the predetermined current may be a current between a turn-on hold current $I_h$ and a set current $I_{set}$ of current-voltage measurement portion 720a as shown in FIG. 7A. In another embodiment, the predetermined current may be a current corresponding to the set voltage $V_{set}$ of current-voltage measurement portion 710a as shown in FIG. 7A.

Meanwhile, referring to FIGS. 8A and 8B, these current-voltage sweep curves with respect to the memory cell 30 can be obtained by applying an input voltage to the memory cell 30 while sweeping, and measuring an output current from the memory cell 30. The current-voltage sweep curve may include current-voltage measurement portions 810a and 810b when the variable resistance element 32 is in a low resistance state and current-voltage measurement portions 820a and 820b when the variable resistance element 32 is in a high resistance state. Further, the current-voltage sweep curve can be classified into first and second sweep graphs 80a and 80b. The first sweep graph 80a may show the result of measuring the output current while continuously increasing the magnitude of the applied voltage to the memory cell 30 from 0 V, as shown in FIG. 8A. The second sweep graph 80b may show the result of measuring the output current while continuously decreasing the magnitude of the applied voltage from a predetermined voltage to 0 V, as shown in FIG. 8B. In an embodiment, the predetermined voltage may be a voltage between a second turn-on threshold voltage $V_{th2'}$ and a set voltage $V_{set'}$ of current-voltage measurement portion 820a as shown in FIG. 8A. In another embodiment, the predetermined voltage may be a voltage corresponding to a set current $I_{s'}$ of current-voltage measurement portion 810a as shown in FIG. 8A.

Determining First and Second Read Voltages

Referring to S130 of FIG. 5, the first and second read voltages applied in the read operation of the memory cell 30 may be determined within a voltage range in which the selection element 31 is in a turned-on state. In an embodiment, determining the first and second read voltages may be performed using the first sweep graph 70a and the second sweep graph 70b of the current-voltage sweep curve illustrated in FIGS. 7A and 7B. Alternatively, in another embodiment, determining the first and second read voltages may be performed using the first sweep graph 80a and the second sweep graph 80b of the current-voltage curve illustrated in FIGS. 8A and 8B.

At first, referring to FIG. 7A, an output voltage may be measured while continuously increasing the magnitude of the applied current from 0 A with respect to the memory cell 30. Referring to the current-voltage measurement portion 710a, when the variable resistive element 32 is in a low resistance state, the selection element 31 may be turned on when the magnitude of the applied current reaches a turn-on threshold current $I_th$. The output voltage may be decreased from a first turn-on threshold voltage $V_{th1}$ to a first turn-on hold voltage $V_{h1}$ until the magnitude of the applied current reaches a turn-on hold current $I_h$. Then, when the magnitude of the applied current is increased from the turn-on hold current $I_h$, the measured output voltage may be increased along the current-voltage measuring portion 710a. Since the selection element 31 is in the turned-on state, the current-voltage characteristic of the memory cell 30 can be determined according to the resistance state of the variable resistance element 32 maintaining the low resistance state.

Meanwhile, referring to the current-voltage measurement portion 720a when the variable resistive element 32 is in a high resistance state, the selection element 31 may be turned on when the applied current reaches the turn-on threshold current $I_{th}$. Next, the output voltage may be decreased from a second turn-on threshold voltage $V_{th2}$ to a second turn-on hold voltage $V_{h2}$ until the magnitude of the applied current reaches the turn-on hold current $I_h$. Then, when the magnitude of the applied current is increased from the turn-on hold current $I_h$, the measured output voltage may be increased along the current-voltage measuring portion 720a. Since the selection element 31 is in the turned-on state, the current-voltage characteristic of the memory cell 30 can be determined according to the resistance state of the variable resistance element 32, which is in a high resistance state.

Next, when the magnitude of the applied current reaches a set current $I_{set}$, a set operation may occur in the variable resistance element 32. By the set operation, the resistance state of the variable resistance state 32 may be changed from the high resistance state to a low resistance state. Specifically, until the magnitude of the applied current reaches a predetermined high current $I_c$ from the set current $I_{set}$, the output voltage may be decreased from a set voltage $V_{set}$ on the current-voltage measurement portion 720a to a predetermined voltage $V_c$ on the current-voltage measurement portion 710a. Then, when the magnitude of the applied current is increased from a predetermined current $I_c$, the measured output voltage may continue along the current-voltage measurement portion 710a representing a low resistance state.

Referring to FIG. 7A, the first read voltage $V_{r1}$ applied to the memory cell 30 may be selected within a voltage range that is higher than the turn-on threshold voltage $V_{th2}$ of the selection element 31, when the variable resistance element 32 is in a high resistance state, and is lower than the set voltage $V_{set}$ of the variable resistance element 32. As an example, the first read voltage $V_{r1}$ may be a voltage corresponding to a first low resistance point $P_{L1}$ on the current-voltage measurement portion 710a when the variable resistance element 32 is in a low resistance state, and may be a voltage corresponding to a first high resistance point $P_{H1}$ on the current-voltage measurement portion 720a when the variable resistance element 32 is in a high resistance state. As such, the first read voltage $V_{r1}$ may be selected within a voltage range in which the resistance states of the variable resistance element 32 can be discriminated from each other, while the selection element 31 is turned on.

Referring to FIG. 7B, the output voltage may be measured while continuously decreasing the magnitude of the applied current from respective first read currents $I_{PL}$ and $I_{PH}$, which both correspond to the determined first read voltage $V_{r1}$, to 0 A. As a result, the second sweep graph 70b of the current-voltage sweep curve with respect to the memory cell 30 can be obtained.

Referring to the current-voltage measurement portion 710b when the variable resistance element 32 is in a low resistance state, when the magnitude of the applied current is decreased from the first read current $I_{PL}$, the magnitude of the output voltage may be decreased along the current-voltage measurement portion 710b. When the applied current reaches a turn-off threshold current $I_{off}$ the selection element 31 may be turned-off. That is, the resistance state of the selection element 31 may be changed from the low resistance state to a high resistance state. When the applied current is decreased below the turn-off threshold current $I_{off}$, the resistance characteristic of the memory cell 30 may exhibit a high resistance state along the current-voltage measurement portion 710b. The output voltage corresponding to the turn-off threshold current $I_{off}$ on the current-voltage measurement portion 710b may be referred to as a first turn-off threshold voltage $V_{off1}$. In an embodiment, the turn-off threshold current $I_{off}$ on the current-voltage measurement portion 710b of FIG. 7B may be a current value substantially the same as the turn-on hold current $I_h$ on the current-voltage measurement portion 710a of FIG. 7A.

Meanwhile, referring to the current-voltage measurement portion 720b when the variable resistive element 32 is in the high resistance state, if the magnitude of the applied current is decreased from the first read current $I_{PH}$, then the output voltage may be decreased along the current-voltage measurement portion 720b. However, when the applied current reaches the turn-off threshold current $I_{off}$, the selection element 31 may be turned off. That is, the resistance state of the selection element 31 may be changed from the low resistance state to a high resistance state. When the applied current is decreased below the turn-off threshold current $I_{off}$, the resistance characteristic of the memory cell 30 may exhibit the high resistance state along the current-voltage measurement portion 720b. The output voltage corresponding to the turn-off threshold current $I_{off}$ on the current-voltage measurement portion 720b may be referred to as a second turn-off threshold voltage $V_{off2}$. In an embodiment, the turn-off threshold current $I_{off}$ on the current-voltage measurement portion 720b of FIG. 7B may substantially the same current value as the turn-on hold current $I_h$ on the current-voltage measurement portion 710a of FIG. 7A. Accordingly, the current-voltage measurement portions 710b and 720b of FIG. 7B may have the same turn-off threshold current $I_{off}$.

In this embodiment, the second read voltage $V_{r2}$ applied to the memory cell 30 may be selected within a voltage range that is higher than the first turn-off threshold voltage $V_{off}$ of the selection element 31 when the variable resistance element 32 is in a low resistance state on the second sweep graph 70b of FIG. 7B, and is lower than the first turn-on threshold voltage $V_{th1}$ of the selection element 31 when the variable resistance element 32 is in the low resistance state on the first sweep graph 70a of FIG. 7A. For convenience of description, portions of the first sweep graph 70a including the first and second turn-on threshold voltages $V_{th1}$ and $V_{th2}$ are added as dotted lines into FIG. 7B. As an example, the second read voltage $V_{r2}$ may correspond to the second low resistance point $P_{L2}$ on the current-voltage measurement portion 710b when the variable resistance element 32 is in a low resistance state, and may correspond to the second high resistance point $P_{H2}$ on the current-voltage measurement portion 720b when the variable resistance element 32 is in a high resistance state.

In another embodiment, a method of determining the first and second read voltages will be described using the first sweep graph 80a and the second sweep graph 80b illustrated in FIGS. 8A and 8B. Referring to FIG. 8A, the output current may be measured while continuously increasing the magnitude of the applied voltage with respect to the memory cell 30 from 0 V. Firstly, referring to the current-voltage measurement portion 810a when the variable resistance element 32 is in a low resistance state, the selection element 31 may be turned on when the magnitude of the applied voltage reaches a first turn-on threshold voltage $V_{th1'}$. When the applied voltage is the first turn-on threshold voltage $V_{th1'}$, the output current may be rapidly increased from a first turn-on threshold current $I_{th1'}$ to a first turn-on hold current $I_{h1'}$. Next, when the magnitude of the applied voltage is increased from the first turn-on threshold voltage $V_{th1'}$, the measured current increases along the current-voltage measurement portion 810a. Since the selection element 31 is in a turned-on state, the current-voltage characteristic of the memory cell 30 may be determined according to the resistance state of the variable resistance element 32 in the low resistance state.

Meanwhile, referring to the current-voltage measurement portion 820a when the variable resistance element 32 is in a high resistance state, the selection element 31 may be turned on when the magnitude of the applied voltage reaches a second turn-on threshold voltage $V_{th2'}$. When the applied voltage is the second turn-on threshold voltage $V_{th2'}$, the output current may be increased from a second turn-on threshold current $I_{th2'}$ to a second turn-on hold current $I_{h2'}$. Next, when the magnitude of the applied voltage is increased from the second turn-on threshold voltage $V_{th2'}$, the measured current may increase along the current-voltage measurement portion 820a. Since the selection element 31 is in a turned-on state, the current-voltage characteristic of the memory cell 30 may be determined according to the resistance state of the variable resistance element 32 in the high resistance state.

Next, when the magnitude of the applied voltage reaches a set voltage $V_{set'}$, a set operation may occur in the variable resistance element 32. In the set operation, the resistance state of the variable resistance element 32 can be changed from the high resistance state to a low resistance state. Specifically, when the applied voltage reaches the set voltage $V_{set'}$, the output current may be increased from a turn-on set current $I_{set'}$ to a set current $I_{s'}$. Next, when the magnitude of the applied voltage is increased from the set voltage $V_{set'}$, the measured current may gradually increase or become saturated along the current-voltage measurement portion 810a.

In this embodiment, the first read voltage $V_{r1'}$ applied to the memory cell 30 may be selected from a voltage range that is higher than the turn-on threshold voltage $V_{th2'}$ when the variable resistance element 32 is in a high resistance state, and is lower than the set voltage $V_{set'}$ of the variable resistance element 32. As an example, the first read voltage $V_{r1'}$ may correspond to a first low resistance point $M_{L1}$ on the current-voltage measurement portion 810a when the variable resistance element 32 is in a low resistance state, and may correspond to a first high resistance point $M_{H1}$ on the current-voltage measurement portion 820a when the variable resistance element 32 is in a high resistance state.

Referring to FIG. 8B, the output current may be measured while continuously decreasing the magnitude of the applied voltage from the determined first read voltage $V_{r1'}$ to 0 V. As a result, the second sweep graph 80b of the current-voltage sweep curve with respect to the memory cell 30 can be obtained.

At first, referring to the current-voltage measurement portion 810b when the variable resistance element 32 is in a low resistance state, when the magnitude of the applied voltage is decreased from the first read voltage $V_{r1'}$, the magnitude of the output current may be decreased along the current-voltage measurement portion 810b. When the applied voltage reaches the first turn-off threshold voltage $V_{off1'}$, the selection element 31 may be turned off. That is, as the resistance state of the selection element 31 is changed from the low resistance state to a high resistance state, the output current may be rapidly decreased when the applied voltage reaches the first turn-off threshold voltage $V_{off1'}$. And, when the applied voltage decreases below the first turn-off threshold voltage $V_{off1'}$, the resistance characteristic of the memory cell 30 may exhibit a high resistance state along the current-voltage measurement portion 810b. In an embodiment, the first turn-off threshold voltage $V_{off1'}$ may have substantially the same magnitude as the first turn-off threshold voltage $V_{off1}$ of the current-voltage measurement section 710b described above with reference to FIG. 7B. In an embodiment, the first turn-off threshold voltage $V_{off1'}$ may be substantially the same as the first turn-on hold voltage $V_{h1}$ of FIG. 7A.

Meanwhile, referring again to FIG. 8B, even if the applied voltage with respect to the memory cell 30 is decreased below the first turn-on threshold voltage $V_{th1'}$ on the first sweep graph 80a of FIG. 8A, when the applied voltage is higher than the first turn-off threshold voltage $V_{off1'}$, the selection element 31 may not be turned off. For convenience of description, portions of the first sweep graph 80a including the first and second turn-on threshold voltages $V_{th1'}$ and $V_{th2'}$ are added as dotted lines into FIG. 8B.

However, the reduction rate of the output current along the current-voltage measurement portion 810b when the applied voltage is between the first turn-off threshold voltage $V_{off1'}$ and the first turn-on threshold voltage $V_{th1'}$ may be relatively greater than the reduction rate of the output current along the current-voltage measurement portion 810b when the applied voltage is higher than the first turn-on threshold voltage $V_{th1'}$. This phenomenon may be explained to be based on the snap-back phenomenon of the selection element 31. One of various theories explaining this phenomenon may be attributed to a plurality of MOS transistor switches in a path through which the applied voltage is transmitted to the memory cell 30. When the applied voltage has a voltage value between the first turn-off threshold voltage $V_{off1'}$ and the first turn-on threshold voltage $V_{th1'}$, the selection element 31 still remains in the turned-on state, but in contrast, the current-voltage characteristic between the channel layers of the MOS transistors electrically connected to the memory cell 30 may change from a saturated operation mode of the transistor to a linear operation mode. When the MOS transistors operate in the linear operation mode, the operation current may vary according to the applied voltage. Accordingly, when the applied voltage is decreased below the first turn-on threshold voltage $V_{th1'}$, the operation current between the source and drain regions through the channel layer may be decreased according to the decreased applied voltage. As a result, when the applied voltage is decreased below the first turn-on threshold voltage $V_{th1'}$, the channel resistance of the MOS transistor that transfers the applied voltage to the memory cell 30 may be increased so that the actual current measured in the current-voltage measurement portion 810b may be decreased.

On the other hand, referring to the current-voltage measurement portion 820b, where the variable resistance element 32 is in a high resistance state, when the magnitude of the applied voltage is decreased from the first read voltage $V_{r1'}$, the magnitude of the output current may be decreased along the current-voltage measurement portion 820b. When the applied current reaches the second turn-off threshold voltage $V_{off2'}$, the selection element 31 may be turned off. That is, as the resistance state of the selection element 31 is changed from a low resistance state to a high resistance state, the output current may be rapidly decreased when the applied voltage reaches the second turn-off threshold voltage $V_{off2'}$. And, when the applied voltage decreases below the second turn-off threshold voltage $V_{off2'}$, the resistance characteristic of the memory cell 30 may exhibit a high resistance state along the current-voltage measurement portion 820b. At this time, in an embodiment, the second turn-off threshold voltage $V_{off2'}$ may have substantially the same value as the second turn-off threshold voltage $V_{off2}$ of the current-voltage measurement portion 710b described above with reference to FIG. 7B. In an embodiment, the second turn-off threshold voltage $V_{off2'}$ may be substantially the same as the second turn-on hold voltage $V_{h2}$ of FIG. 7A.

In this embodiment, the second read voltage $V_{r2'}$ applied to the memory cell 30 may be selected from voltage range that is higher than the turn-off threshold voltage $V_{off1'}$ of the selection element 31 when the variable resistance element 32 is in a low resistance state on the second sweep graph 80b shown in FIG. 8B, and is lower than the turn-on threshold voltage $V_{th1'}$ of the selection element 31 when the variable resistance element 32 is in a low resistance state on the first sweep graph 80a shown in FIG. 8A. As an example, the second read voltage $V_{r2'}$ may correspond to a second low resistance point $M_{L2}$ on the current-voltage measurement portion 810b when the variable resistance element 32 is in a low resistance state, and may correspond to a second high resistance point $M_{H2}$ on the current-voltage measurement portion 820b when the variable resistance element 32 is in a high resistance state.

Measuring First and Second Cell Currents by Applying First and Second Read Voltages A read operation with respect to the memory cell 30 may be performed using the determined first and second read voltages as follows. Referring to S140 of FIG. 5, a first cell current may be measured by applying the first read voltage to the memory cell 30. In addition, referring to S150 of FIG. 5, a second cell current may be measured by applying the second read voltage to the memory cell 30. The first and second read voltages may be voltages determined in step S130.

In an embodiment, the process of measuring the first and second cell currents by applying the first and second read voltages may be performed as follows. First, after the voltage applied to the memory cell 30 is increased from 0 V to the first read voltage, a current output as the first cell current may be measured at the first read voltage. Subsequently, after the voltage applied to the memory cell 30 is decreased from the first read voltage to the second read voltage, a current output as the second cell current may be measured at the second read voltage.

In an embodiment, the process of decreasing the voltage from the first read voltage to the second read voltage may include continuously decreasing the voltage while applying voltage to the memory cell 30.

Figure 9:
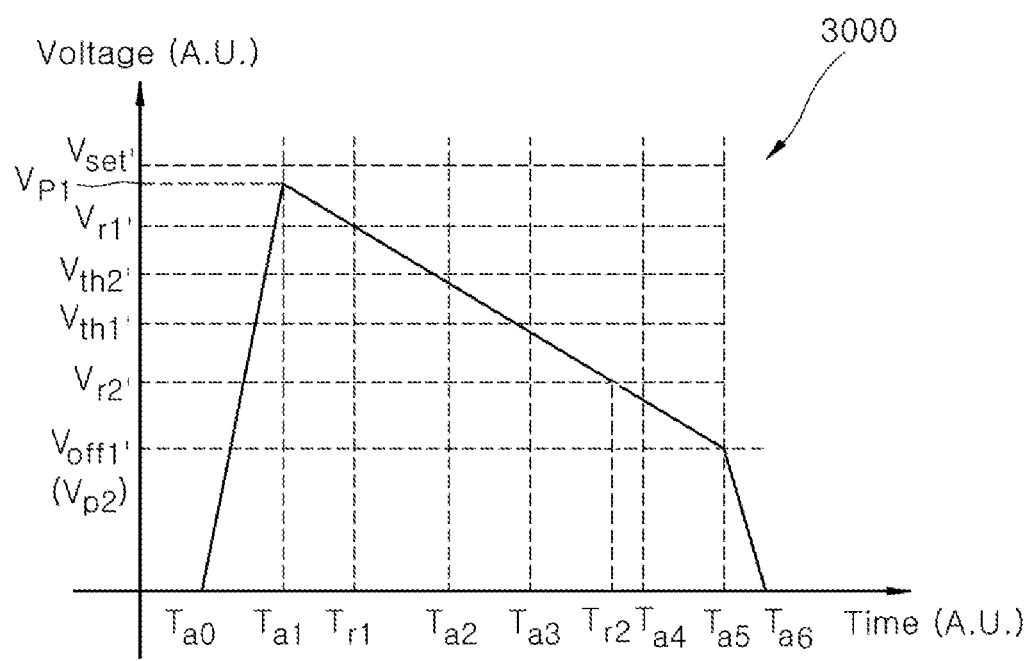
FIG. 9 is a view schematically illustrating an input pulse for applying a read voltage to a memory cell of a resistive memory device, in an embodiment of the present disclosure.

FIG. 9 is a view schematically illustrating an input pulse for applying a read voltage to a memory cell, in an embodiment of the present disclosure. Referring FIG. 9, a process of applying the first and second read voltage to the memory cell 30 may include applying a single input pulse 3000. The input pulse 3000 may have a plurality of voltage amplitudes continuously distributed within a predetermined time width. The voltage amplitude of the input pulse 3000 will be described using the voltages on the current-voltage sweep curves of FIGS. 8A and 8B.

Specifically, the input pulse 3000 may have a time width of $T_{a0}$ to $T_{a5}$ and may have a first peak voltage $V_{p1}$ and a second peak voltage $V_{p2}$ during the time width. The first peak voltage $V_{p1}$ may be higher than a second turn-on threshold voltage $V_{th2'}$ of the variable resistance element 32 and lower than a set voltage $V_{set'}$. In an embodiment, the second peak voltage $V_{p2}$ may be equal to or higher than a first turn-off threshold voltage $V_{off1'}$ and lower than a second read voltage $V_{r2'}$. However, the magnitude of the second peak voltage $V_{p2}$ is not limited as long as it satisfies the conditions that it is different from the magnitude of the first peak voltage $V_{p1}$. In some other examples, the second peak voltage $V_{p2}$ may not exist or be used.

Referring again to FIG. 9, the amplitude of the input pulse 3000 may be continuously increased from 0 V to the first peak voltage $V_{p1}$ during a time period from $T_{a0}$ to $T_{a1}$. Subsequently, the amplitude of the voltage may be continuously decreased from the first peak voltage $V_{p1}$ to 0 V through the second peak voltage $V_{p2}$ during a time period from $T_{a1}$ to $T_{a6}$. The first read voltage $V_{r1'}$ may be higher than the second turn-on threshold voltage $V_{th2'}$ and lower than the first peak voltage $V_{p1}$. The first read voltage $V_{r1'}$ may be applied to the memory cell 30 at a first read time $T_{r1}$ in a period in which the amplitude of the voltage is decreased. The second read voltage $V_{r2'}$ may be higher than the first turn-off threshold voltage $V_{off'}$ and lower than the first turn-on threshold voltage $V_{th1'}$. The second read voltage $V_{r2'}$ may be applied to the memory cell 30 at a second read time $T_{r2}$ in a period in which the amplitude of the voltage is decreased. As illustrated, the second read voltage $V_{r2'}$ may be applied to the memory cell 30 after the first read voltage $V_{r1'}$ is applied. The times $T_{a2}$, $T_{a3}$, and $T_{a5}$ shown in FIG. 9 may correspond to the second turn-on threshold voltage $V_{th2'}$, the first turn-on threshold voltage $V_{th1'}$, and the first turn-off threshold voltage $V_{off1'}$, respectively.

Figure 10:
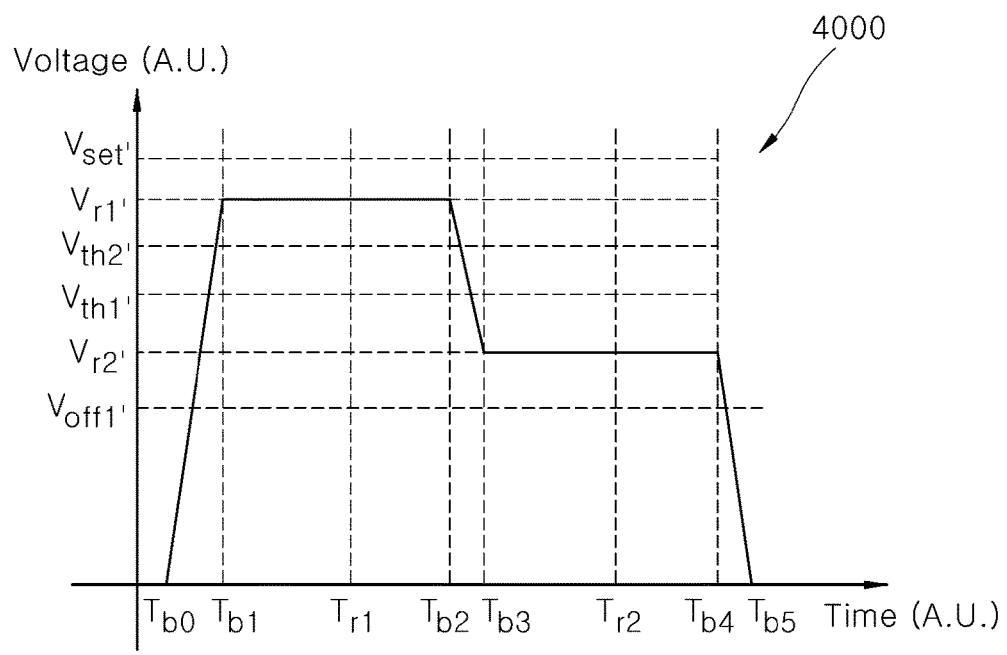
FIG. 10 is a view schematically illustrating an input pulse for applying a read voltage to a memory cell of a resistive memory device, in another embodiment of the present disclosure.

FIG. 10 is a view schematically illustrating an input pulse for applying a read voltage to a memory cell, in another embodiment of the present disclosure. Referring to FIG. 10, a process of applying the first and second read voltages to the memory cell 30 may include applying a single input pulse 4000. The input pulse 4000 may have a voltage amplitude continuously distributed within a predetermined time width. The voltage amplitude of the input pulse 4000 will be described using voltages on the current-voltage sweep curves of FIGS. 8A and 8B.

Specifically, the input pulse 4000 may have a time width from $T_{b0}$ to $T_{b5}$ and may have first and second peak voltages during the time width. The first peak voltage may correspond to the first read voltage $V_{r1'}$ and the second peak voltage may correspond to the second read voltage $V_{r2'}$.

The first read voltage $V_{r1'}$ may be higher than the second turn-on threshold voltage $V_{th2'}$ of the variable resistance element 32 and lower than the set voltage $V_{set'}$. The second read voltage $V_{r2'}$ may be higher than the first turn-off threshold voltage $V_{off1'}$ and lower than the first turn-on threshold voltage $V_{th1'}$.

Referring again to FIG. 10, the amplitude of the input pulse 4000 may be continuously increased from 0 V to the first peak voltage having substantially the same magnitude as that of the first read voltage $V_{r1'}$ for a time period from $T_{b0}$ to $T_{b1}$. Next, the amplitude of the input pulse 4000 may be kept constant during a time period from $T_{b1}$ to $T_{b2}$. The first read voltage $V_{r1'}$ may be applied to the memory cell 30 at a predetermined first read time $T_{r1}$ within a time period from $T_{b1}$ to $T_{b2}$. During a time period from $T_{b2}$ to $T_{b3}$, the amplitude of the applied voltage may be continuously decreased. Next, the amplitude of the applied voltage may be kept constant during a time period from $T_{b3}$ to $T_{b4}$. The second read voltage $V_{r2'}$ may be applied to the memory cell 30 at a predetermined read time $T_{r2}$ within a time period from $T_{b3}$ to $T_{b4}$. During a time period from $T_{b4}$ to $T_{b5}$, the amplitude of the applied voltage may be continuously decreased to 0 V. A time corresponding to the first turn-off threshold voltage $V_{off1'}$ may be arranged between $T_{b4}$ and $T_{b5}$.

Although an example of the input pulse for applying the first and second read voltages has been described above, the present disclosure is not limited thereto, and various other types of input pulses may exist. However, also in this case, the voltage amplitude of the input pulse can continuously change within a predetermined time width. Then, the first and second read voltages having different voltage amplitudes within a single input pulse may be determined. The second read voltage may be a voltage whose magnitude is smaller than that of the first read voltage. The second read voltage may be subsequently applied after the first read voltage is applied.

Determining Resistance State Stored in a Memory Cell

Figure 11:
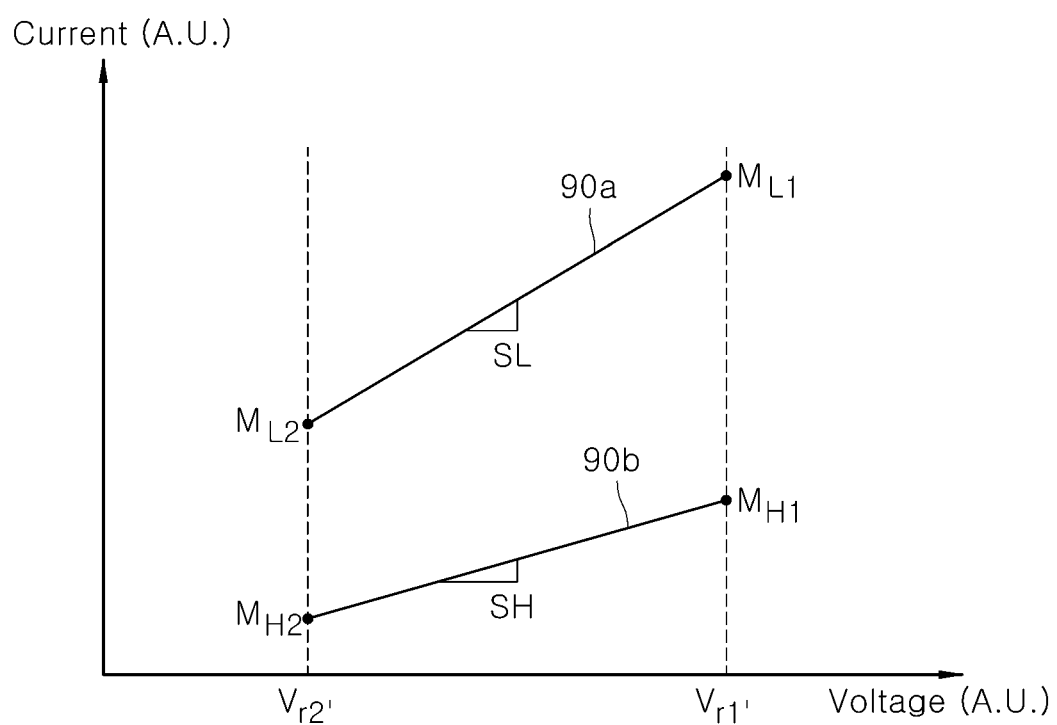
FIG. 11 is a view illustrating a method of determining a resistance state using a cell current measured from a memory cell of a resistive memory device, in an embodiment of the present disclosure.

FIG. 11 is a view illustrating a method of determining a resistance state using a cell current measured from a memory cell, in an embodiment of the present disclosure.

Referring to S160 of FIG. 5, a resistance state stored in the memory cell 30 may be determined based on the first and second cell currents. Specifically, a process of determining the resistance state stored in the memory cell 30 may include calculating a difference of the first and second cell currents according to a voltage difference between the first and second read voltages $V_{r1'}$ and $V_{r2'}$ to calculate a slope or variation of the cell currents with respect to the voltage difference, and comparing the slope or variation of the cell currents with a predetermined reference variation or a predetermined reference slope. As a result, the resistance state may be determined to be a low resistance state when the variation or the slope of the cell currents is greater than or equal to a predetermined reference variation or a predetermined reference slope, and the resistance state may be determined to be a high resistance state when the variation or the slope of the cell currents is less than the reference variation or the reference slope.

According to an embodiment, the input pulse 4000 of the voltage shown FIG. 9 or FIG. 10 may be applied to the memory cell 30. As a result, the first cell current and the second cell current were measured at the first read voltage $V_{r1'}$ and the second read voltage $V_{r2'}$, respectively. For convenience of description, the measurement result of the second sweep graph 80b of FIG. 8B may be used.

At first, when the variable resistance element 32 is in a low resistance state, first and second low resistance points $M_{L1}$ and $M_{L2}$ can be determined, as a result of the read operation. Meanwhile, when the variable resistance element 32 is in a high resistance state, first and second high resistance points $M_{H1}$ and $M_{H2}$ can be determined, as a result of the read operation.

Next, a sloped line 90a connecting the first and second low resistance points $M_{L1}$ and $M_{L2}$ can be obtained. From the sloped line 90a, a slope SL of the cell currents when the variable resistance element 32 is in a low resistance state can be obtained. In the same manner, a sloped line 90b connecting the first and second high resistance points $M_{H1}$ and $M_{H2}$ can be obtained. From the sloped line 90b, a slope SH of the cell currents when the variable resistance element 32 is in a high resistance state can be obtained.

Referring again to FIG. 8B, the voltage range in which the second read voltage $V_{r2'}$ is applied may be a voltage range in which the output current is rapidly decreased when the variable resistance element 32 is in a low resistance state. In contrast, the voltage range in which the second read voltage $V_{r2'}$ is applied may be a voltage range in which the output current is gradually decreased when the variable resistance element 32 is in a high resistance state. Accordingly, in FIG. 11, the slope SL of the cell currents connecting the first and second low resistance points $M_{L1}$ and $M_{L2}$ may be greater than the slope SH of the cell currents connecting the first and second high resistance points $M_{H1}$ and $M_{H2}$. Thus, when the variable resistance element 32 is in the low resistance state and in the high resistance state, the slope of the cell currents can be effectively identified. Consequently, if the slope of the cell currents is equal to or greater than a predetermined reference slope, the resistance state of the memory cell may be determined to be a low resistance state, and if the slope of the cell currents is less than the predetermined reference slope, the resistance state of the memory cell may be determined to be a high resistance state. The reference slope can be calculated based on a database obtained by performing a read operation on a plurality of memory cells having a known resistance state.

The above-described method of determining the resistance state of the memory cell may be performed through the application of the read voltage twice and the measurement of the cell current twice with respect to the same memory cell. Therefore, it is possible to reduce reading errors between the memory cells, and the reliability of the read operation of the memory cell can be improved. In other words, there is a deviation on the current-voltage characteristic curve between the memory cells, so that different cell currents can exist among the memory cells even at the same read voltage. According to the embodiment of the present disclosure, the resistance state of the memory cell can be determined through the variation or the slope of the cell currents measured twice for the same memory cell, thereby preventing errors in the read operation based on the deviation on the current-voltage characteristic curve.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A method of reading a resistive memory device comprising:
    preparing a memory cell including a selection element and a variable resistance element, the selection element exhibiting a snap-back behavior on a current-voltage sweep curve for the memory cell;
    determining first and second read voltages to be applied to the memory cell within a voltage range in which the selection element maintains a turned-on state, the second read voltage being lower than the first read voltage and the second read voltage being selected in a voltage range in which the selection element exhibits the snap-back behavior;
    applying the first read voltage to the memory cell to measure a first cell current;
    applying the second read voltage to the memory cell to measure a second cell current; and
    determining a resistance state stored in the memory cell based on the first cell current and the second cell current.

2. The method of claim 1,
    wherein the resistive memory device comprises a first conductive line extending in a first direction and a second conductive line extending in a second direction, and wherein the memory cell is located along a third direction in a region between the first and second conductive lines.

3. The method of claim 1, wherein the current-voltage sweep curve is a curve obtained by applying an input current to the memory cell while sweeping the input current and measuring an output voltage from the memory cell.

4. The method of claim 1, wherein the current-voltage sweep curve is a curve obtained by applying an input voltage to the memory cell while sweeping the input voltage and measuring an output current from the memory cell.

5. The method of claim 1, wherein the current-voltage sweep curve comprises a current-voltage measurement portion when the variable resistance element is in a low resistance state and a current-voltage measurement portion when the variable resistance element is in a high resistance state.

6. The method of claim 1,
wherein the current-voltage sweep curve is obtained by measuring the output voltage after applying the input current to the memory cell while sweeping, and
wherein the snap-back behavior includes decreasing output voltage as the applied current increases in a current range equal to or higher than a turn-on threshold current of the selection element.

7. The method of claim 1,
wherein determining the first read voltage comprises:
measuring the output voltage while continuously increasing a magnitude of the applied current to the memory cell from 0 A to obtain a first sweep graph of the current-voltage sweep curve; and
selecting one voltage value within a voltage range that is higher than a turn-on threshold voltage of the selection element when the variable resistance element is in a high resistance state and that is lower than a set voltage of the variable resistance element on the first sweep graph.

8. The method of claim 7,
wherein determining the second read voltage comprises:
measuring the output voltage while continuously decreasing a magnitude of the applied current from a predetermined current to 0 A to obtain a second sweep graph of the current-voltage sweep curve; and
selecting one voltage value within a voltage range that is higher than a turn-off threshold voltage of the selection element when the variable resistance element is in a low resistance state and is lower than a turn-on threshold voltage of the selection element on the first sweep graph.

9. The method of claim 8, wherein the turn-off threshold current of the selection element has substantially the same magnitude as a turn-on hold current on the first sweep graph when the variable resistance element is in a low resistance state after the snap-back behavior is exhibited.

10. The method of claim 1,
wherein determining the first read voltage comprises:
measuring the output current while continuously increasing a magnitude of the applied voltage for the memory cell from 0 V to obtain a first sweep graph of the current-voltage sweep curve; and selecting one voltage value within a voltage range that is higher than a turn-on threshold voltage of the selection element when the variable resistance element is in a high resistance state and that is lower than a set voltage of the variable resistance element.

11. The method of claim 10,
wherein determining the second read voltage comprises:
measuring the output current while continuously decreasing a magnitude of the applied voltage from a predetermined voltage to 0 V to obtain a second sweep graph of the current-voltage sweep curve; and
selecting one voltage value within a voltage range that is higher than a turn-off threshold voltage of the selection element when the variable resistance element is in a low resistance state on the second sweep graph and that is lower than a turn-on threshold voltage of the selection element when the variable resistance element is in a low resistance state on the first sweep graph.

12. The method of claim 1,
wherein measuring the first cell current by applying the first read voltage comprises increasing the voltage applied to the memory cell from 0 V to the first read voltage and then measuring the output current at the first read voltage, and
wherein measuring the second cell current by applying the second read voltage comprises decreasing the voltage applied to the memory cell from the first read voltage to the second read voltage and then measuring the output current at the second read voltage.

13. The method of claim 12, wherein decreasing the voltage from the first read voltage to the second read voltage comprises continuously reducing the voltage while voltage is applied to the memory cell.

14. The method of claim 1, wherein applying the first read voltage and applying the second read voltage to the memory cell comprises applying a single input pulse having continuously varying voltage amplitudes.

15. The method of claim 14, wherein the voltage amplitudes within the single input pulse are continuously distributed according to the time.

16. The method of claim 1,
wherein determining the resistance state stored in the memory cell based on the first cell current and the second cell current comprises:
calculating a difference of the first and second cell currents according to a voltage difference between the first and second read voltages to calculate a slope of the cell currents with respect to the voltage difference; and
comparing the slope of the cell currents with a predetermined reference slope.

17. The method of claim 16,
wherein the resistance state is determined to be a low resistance state when the slope of the cell currents is equal to or greater than the predetermined reference slope, and
wherein the resistance state is determined to be a high resistance state when the slope of the cell currents is less than the predetermined reference slope.

* * * * *